US012665163B2

(12) United States Patent
Dravid et al.

(10) Patent No.: US 12,665,163 B2
(45) Date of Patent: Jun. 23, 2026

(54) MICROCHIPS FOR USE IN ELECTRON MICROSCOPES AND RELATED METHODS

(71) Applicant: Northwestern University, Evanston, IL (US)

(72) Inventors: Vinayak P. Dravid, Glenview, IL (US); Xiaobing Hu, Evanson, IL (US); Kunmo Koo, Skokie, IL (US)

(73) Assignee: Northwestern University, Evanston, IL (US)

( * ) Notice: Subject to any disclaimer, the term of this patent is extended or adjusted under 35 U.S.C. 154(b) by 315 days.

(21) Appl. No.: 18/479,994

(22) Filed: Oct. 3, 2023

(65) Prior Publication Data

US 2024/0120172 A1    Apr. 11, 2024

Related U.S. Application Data

(60) Provisional application No. 63/413,097, filed on Oct. 4, 2022.

(51) Int. Cl.
*H01J 37/244* (2006.01)
*B81C 1/00* (2006.01)
*H01J 37/26* (2006.01)

(52) U.S. Cl.
CPC ........ *H01J 37/244* (2013.01); *B81C 1/00119* (2013.01); *H01J 37/26* (2013.01);
(Continued)

(58) Field of Classification Search
CPC ........... H01J 37/26–2955; H01J 37/244; H01J 2237/28–2818; H01J 2237/2801;
(Continued)

(56) References Cited

U.S. PATENT DOCUMENTS 9,548,184 B2    1/2017  Creemer et al.
2001/0052576 A1*  12/2001  Shimada ................ G21K 1/087
250/492.1
(Continued)

FOREIGN PATENT DOCUMENTS

JP    2001313240 A  * 11/2001
JP    2016110877 A    6/2016
JP    6492602 B2    4/2019

OTHER PUBLICATIONS

English Translation of Hiroshi (JP 2001-313240) (Year: 2001).*

(Continued)

*Primary Examiner* — Zandra V Smith
*Assistant Examiner* — Douglas Yap
(74) *Attorney, Agent, or Firm* — Bell & Manning, LLC

(57) ABSTRACT

Method for fabricating a microchip are provided which may comprise forming a dopant mask layer on a front side surface of a silicon substrate having the front side surface and an opposing back side surface; removing a portion of the dopant mask layer according to a pattern to form a first exposed silicon region in the silicon substrate and a first unexposed silicon region in the silicon substrate; doping the first exposed silicon region in the silicon substrate with a p-type dopant to form a first p-type doped silicon region in the silicon substrate; forming a silicon nitride layer on the front side surface of the silicon substrate comprising the first p-type doped silicon region and the first unexposed silicon region; and forming an opening in the silicon substrate from the opposing back side surface of the silicon substrate to provide a microchip comprising the silicon substrate having the opening, a first silicon nitride window positioned within the opening, and a support structure mounted to the first silicon nitride window, the support structure comprising the (Continued)

first p-type doped silicon region. The fabricated microchips and methods of using the microchips are also provided.

16 Claims, 10 Drawing Sheets

(52) U.S. Cl.
CPC ................. *B81C 2201/0133* (2013.01); *H01J 2237/24455* (2013.01)

(58) Field of Classification Search
CPC ..... H01J 2237/2802; H01J 2237/24455; H01J 37/20; B81C 2201/0133; B81C 2201/0135; B81C 2201/0136; B81C 2201/0147; B81C 2201/0149; B81C 2201/015–0154; H10P 50/64–648; H10P 50/69–696; B01L 3/508–5088; G01N 1/31; G01N 1/312; G02B 21/34–368; B82Y 35/00
See application file for complete search history.

(56) References Cited

U.S. PATENT DOCUMENTS

| | | | |
|---|---|---|---|
| 2010/0140497 A1* | 6/2010 | Damiano, Jr. .......... | B01L 3/508 |
| | | | 427/209 |
| 2011/0107472 A1* | 5/2011 | Han ........................ | H01J 37/26 |
| | | | 250/311 |

OTHER PUBLICATIONS

E.A. Ring et al., "Silicon Nitride Windows for Electron Microscopy of Whole Cells," *J Microsc.* Sep. 2011; 243(3): 273-283. Doi:10.1111/j.1365-2818.2011.03501. x.

Madeline J. Dukes et al., "Improved Microchip Design and Application for In Situ Transmission Electron Microscopy of Macromolecules," *Microsc. Microanal.* 20, 338-345, 2014. Doi:10.1017/S1431927613013858.

* cited by examiner two silicon nitride windows microchip back side

Array of silicon nitride windows two silicon nitride windows microchip front side

MICROCHIPS FOR USE IN ELECTRON MICROSCOPES AND RELATED METHODS

CROSS-REFERENCE TO RELATED APPLICATIONS

The present application claims priority to U.S. provisional patent application No. 63/413,097 that was filed Oct. 4, 2022, the entire contents of which are incorporated herein by reference.

REFERENCE TO GOVERNMENT RIGHTS

This invention was made with government support under grant number ECCS2025633 awarded by the National Science Foundation. The government has certain rights in the invention.

BACKGROUND

Using a thin membrane as a sample support is crucial for high resolution electron microscopy imaging. The membrane itself induces chromatic aberration and beam broadening, which can significantly reduce the image quality. Low stress silicon nitride (LSN) has been used for membranes because of its superb toughness, material impermeability, ease of manufacturing, and desirable electron transparency. However, thin LSN membranes crack easily during sample preparation and manufacturing. In addition, because of the nature of anisotropic etching of silicon, the silicon substrates used to support LSN membranes become wedged, which makes it difficult to position LSN membranes close to one another in an array. Furthermore, when configured to encapsulate fluids (liquid or gas), LSN membrane deflection induced by the pressure gradient formed across the LSN membrane greatly reduces spatial resolution of electron microscope images.

SUMMARY

The present disclosure provides methods for fabricating microchips comprising silicon nitride windows. The microchips and methods of using the microchips, e.g., in electron microscopes, are also provided.

An embodiment of a method for fabricating a microchip comprises forming a dopant mask layer on a front side surface of a silicon substrate having the front side surface and an opposing back side surface; removing a portion of the dopant mask layer according to a pattern to form a first exposed silicon region in the silicon substrate and a first unexposed silicon region in the silicon substrate; doping the first exposed silicon region in the silicon substrate with a p-type dopant to form a first p-type doped silicon region in the silicon substrate; forming a silicon nitride layer on the front side surface of the silicon substrate comprising the first p-type doped silicon region and the first unexposed silicon region; and forming an opening in the silicon substrate from the opposing back side surface of the silicon substrate to provide a microchip comprising the silicon substrate having the opening, a first silicon nitride window positioned within the opening, and a support structure mounted to the first silicon nitride window, the support structure comprising the first p-type doped silicon region.

An embodiment of a microchip comprises a silicon substrate having a front side surface, a back side surface, and an opening extending from the back side surface to the front side surface; a first silicon nitride window positioned within the opening and at the front side surface of the silicon substrate; and a support structure mounted to the silicon nitride window, the support structure comprising a first p-type doped silicon region and a first silicon nitride overlayer on the first p-type doped silicon region. Other principal features and advantages of the disclosure will become apparent to those skilled in the art upon review of the following drawings, the detailed description, and the appended claims.

BRIEF DESCRIPTION OF THE DRAWINGS

Illustrative embodiments of the disclosure will hereafter be described with reference to the accompanying drawings.

DETAILED DESCRIPTION

Transmission electron microscopes utilize a high energy electron beam to provide nanoscopic images of materials. To enhance spatial resolution, a typical electron microscope is operated between tens of keV to several MeV. The resolution of the electron microscope depends upon its electrooptical parameters, electron interaction with the sample, and the efficiency of the detector. Of these, the sample itself affects the spatial resolution of the resulting image, from subatomic scale to several nanometers. When electrons penetrate into the sample, they lose energy, resulting in chromatic aberration in the final image. Additionally, electrons with a broad energy profile reduce achievable maximum resolution. For these reasons, very thin samples are desirable obtain high resolution TEM images.

Figure 1:
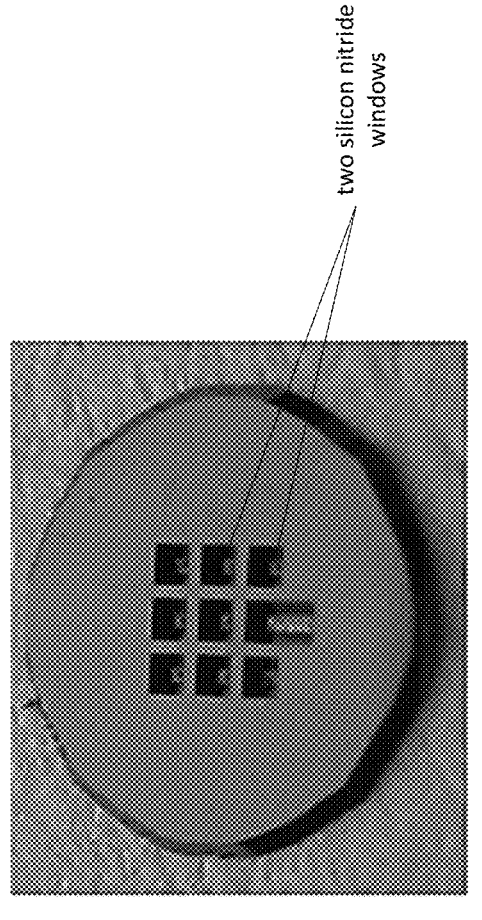
FIG. 1 shows images of the front (left) and back (right) sides of a microchip fabricated using existing methods.
Figure 1:
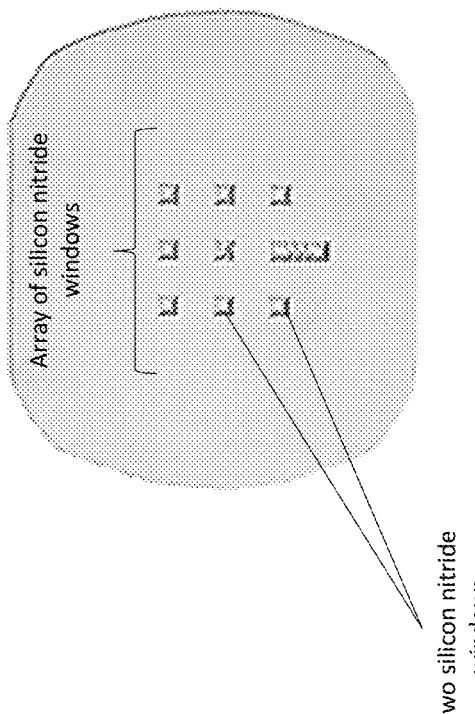

Low stress silicon nitride (LSN) has been used as a window and sample support in electron microscopes. Standardized micro electro mechanical systems (MEMS) fabrication techniques may be used to grow stress-free nanometer-thick films of LSN on a silicon substrate. As shown in FIG. 1, the necessary removal of some of the silicon substrate to provide the LSN window creates a wedged geometry in which the opening at the front side of the silicon substrate is significantly smaller than the opening at the back side. This limits the area of the window/sample support as well as limits the density of the windows that may be provided in an array of windows.

Microchips may also be configured to provide environmental encapsulation within electron microscopes that are typically operated under ultra-high vacuum ($10^{-5}$ Pa) to avoid the scattering from the optics. Microchip stacks (e.g., two microchips) can be configured to provide an isolated compartment to contain a fluid (liquid or gas), including a desired sample, without losing these materials to the surrounding vacuum. However, this results in a pressure gradient developing across an LSN window of the microchip. This deflects the LSN window toward the region of lower pressure and increases the overall thickness of the sample, e.g., up to several tens of micrometers. This makes atomic resolution imaging nearly impossible. To achieve atomic resolution (e.g., less than 1 Å) with a liquid sample, the deflection is desirably limited to no greater than 50 nm. The deflection of a LSN window may be expressed using Equation 1:

$$p = 2\frac{\sigma_0 t}{a^2}d + \frac{8}{6}\frac{Et}{a^4(1-v^2)}d^3 \qquad \text{Equation 1}$$

Figure 2:
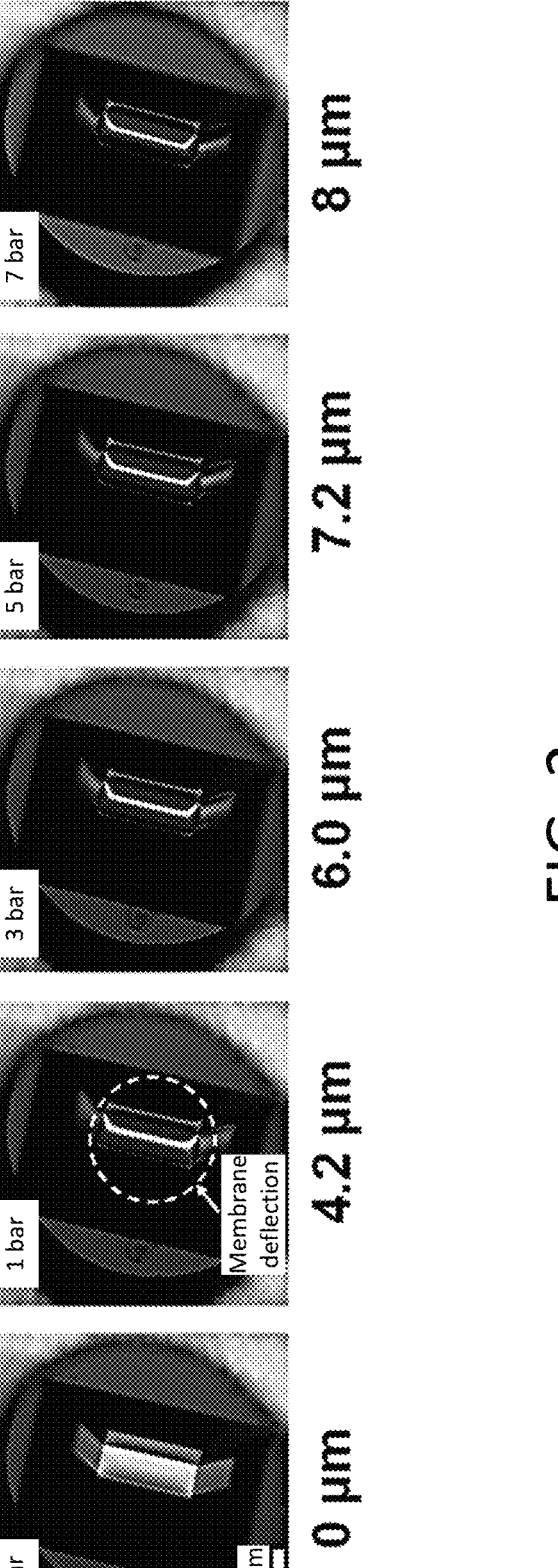
FIG. 2 shows images of the deflection of a silicon nitride window (membrane) that is 50 μm wide and 50 nm thick under various pressures. The magnitude of the pressure is listed at the top and the magnitude of the deflection is listed at the bottom.

In Equation 1, p is the pressure gradient, $\sigma_0$ is residual stress, t is thickness of the LSN window, a is width of the LSN window, d is the deflection of the LSN window, E is the Young's modulus of the LSN window, and v is Poisson's ratio for the LSN window. An LSN window having a thickness t of 50 nm and a width a of 50 μm usually deflects up to 500 nm under a pressure gradient of 6000 Pa. LSN window deflections (magnitude of the deflection shown at the bottom) at even higher pressures (magnitude of the pressures are shown at the top) are shown in FIG. 2.

Conventional microchip fabrication processes have not been able to achieve atomic resolution for liquid samples due, at least in part, to the deflection problem. Although Equation 1 provides that the LSN window desirably has a large t and small a to minimize deflection, thick LSN windows degrade resolution due to additional electron scattering and reducing a undesirably limits window area and density.

The present disclosure provides new methods for fabricating microchips comprising silicon nitride windows. The microchips and methods of using the microchips, e.g., in electron microscopes, are also provided.

The present methods make use of p-type silicon doping. Briefly, a silicon substrate from which the microchip is fabricated may be doped with a p-type element to achieve a relatively high concentration of holes therein. This reduces the number of available electrons in the conduction band of silicon and prevents the formation of an etch intermediate, e.g., $Si(OH)_4$, within the silicon. This decreases the etch rate in the p-type doped silicon, e.g., by up to 100-fold. The p-type doping may be localized to the front side of the silicon substrate and silicon substrate etched from the back side to form an opening in the silicon substrate while providing a support structure comprising p-type doped silicon. The support structure is mounted to a silicon nitride window positioned within the opening. The silicon nitride window may be one of a plurality of silicon nitride windows mounted to the support structure.

Figure 3A:
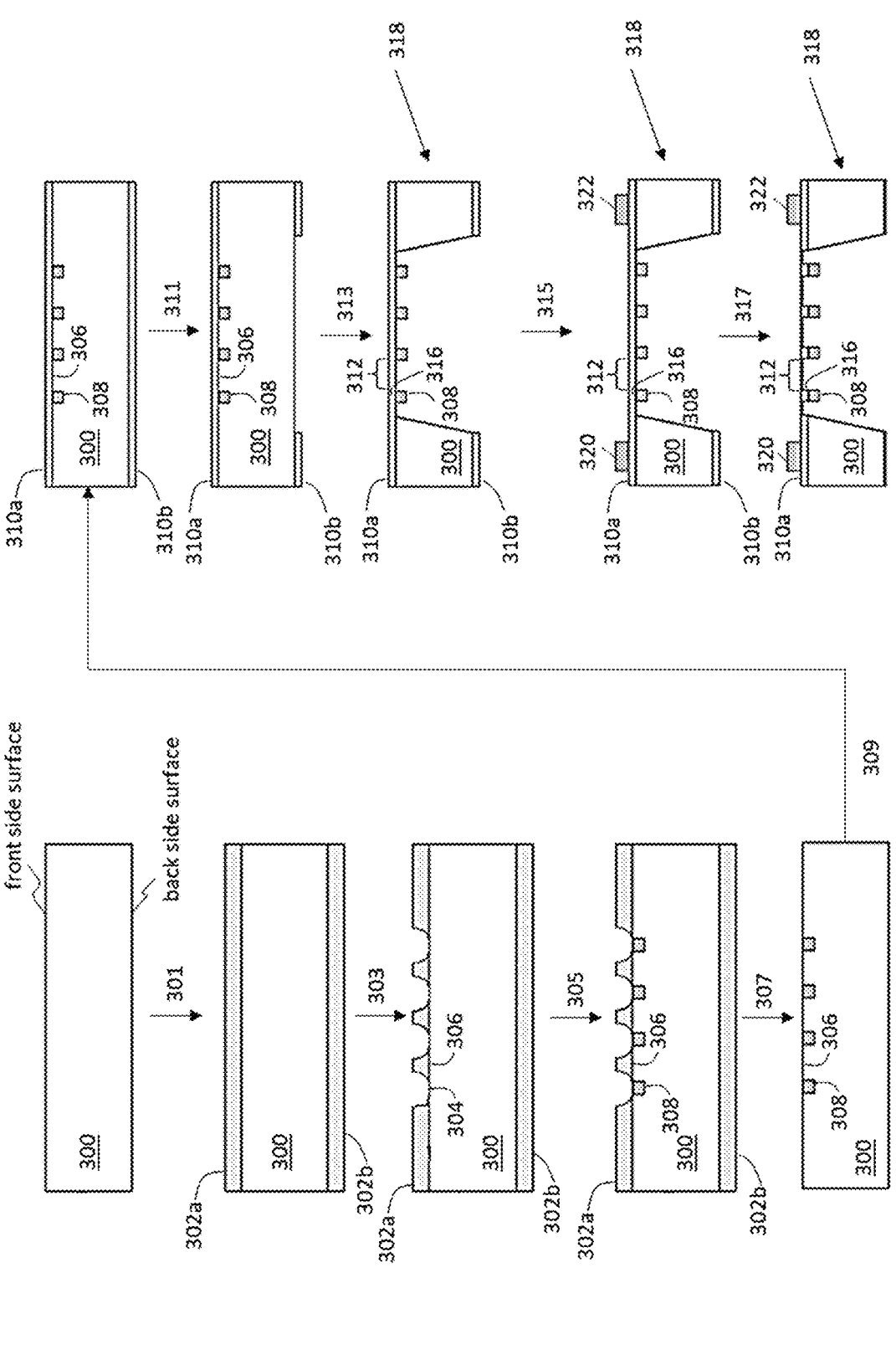
FIG. 3A shows cross-sectional views of the steps of an illustrative method for fabricating a microchip.
Figure 3B:
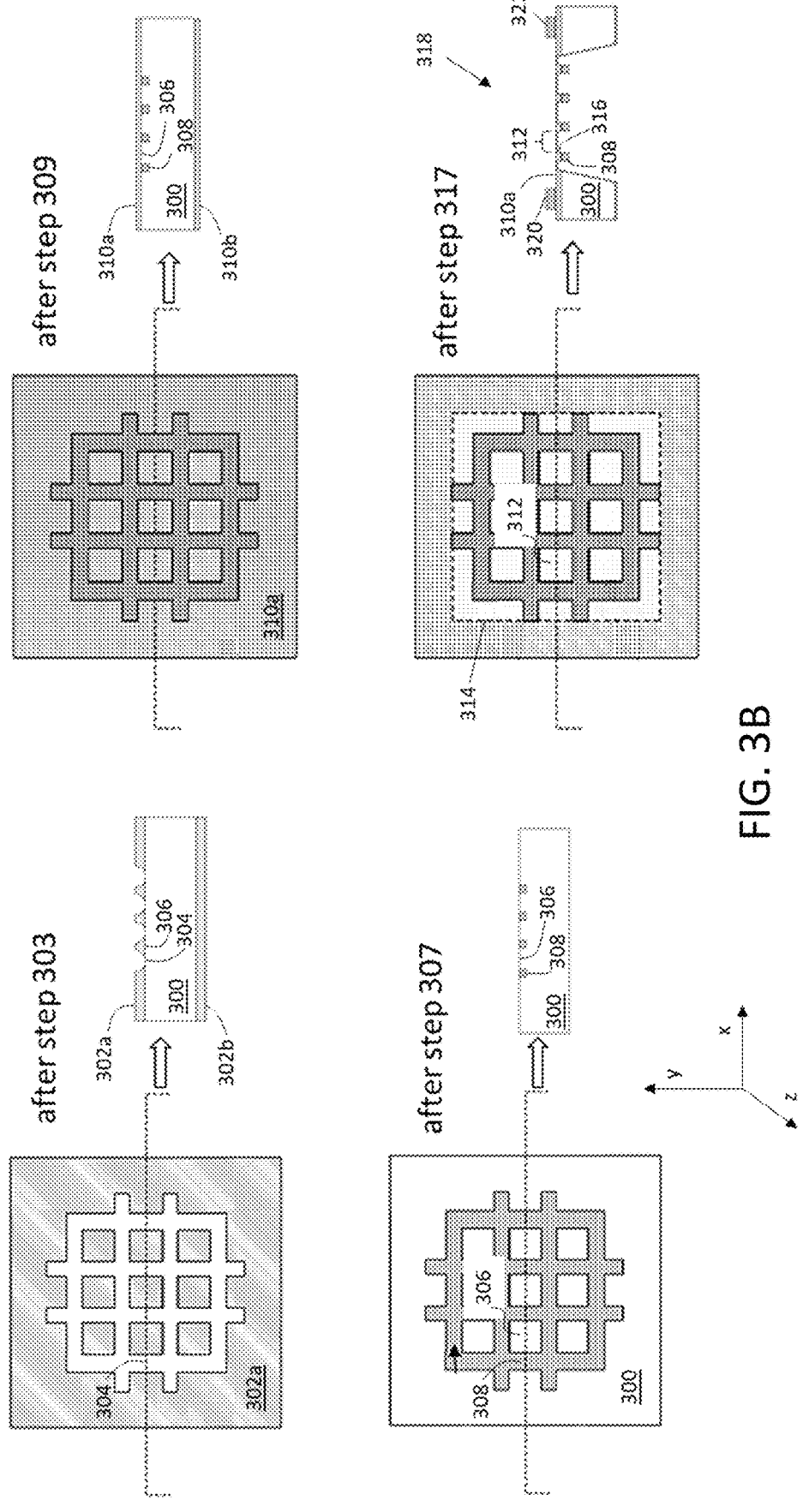
FIG. 3B shows top, in-plane views of the steps of the illustrative method of FIG. 3A.

The steps of an illustrative method for fabricating a microchip 318 are illustrated in FIGS. 3A and 3B. FIG. 3A shows cross-sectional views (taken along the xz plane) for steps 301-317 while FIG. 3B shows top, in-plane views (taken along the xy plane) during the method after step 303, after step 307, after step 309, and after step 317. In FIG. 3B, the corresponding xz cross-sectional views (taken along the dotted lines) are also shown to the right of each in-plane view. The steps and the order shown in FIGS. 3A and 3B are not intended to be limiting, as variations may be used in which additional or fewer steps are used and/or a different order is used.

The illustrative method begins by providing a silicon substrate 300 having a front side surface and back side surface. The silicon substrate 300 desirably has a hole concentration of less than $10^{19}$ cm$^{-3}$. This includes a hole concentration of less than $10^{17}$ cm$^{-3}$, less than $10^{15}$ cm$^{-3}$, and less than $10^{13}$ cm$^{-3}$. The silicon substrate 300 may be an undoped silicon substrate having a hole concentration of about $10^{10}$ cm$^-$ This facilitates the subsequent removal of a portion of the silicon substrate 300, e.g., via anisotropic wet etching, as further described below. The thickness of the silicon substrate 300 (measured along z) may depend upon the optical column in an electron microscope in which the microchip 318 is to be used, but may be on the order of a few hundred microns, e.g., from 300 μm to 500 μm. The silicon substrate 300 may comprise or consist of silicon.

In a step 301, dopant mask layers 302a, b are formed on respective sides of the silicon substrate 300. The dopant mask layers 302a, b may comprise or consist of $SiO_2$ (which may be formed, e.g., via wet oxidation) and may each have a thickness in a range of from a few tens of nanometers to several micrometers, e.g., from 20 nm to 5 μm. Other similar materials (e.g., oxides and nitrides) and techniques may be used to form the dopant mask layers 302a, b.

In a step 303, a portion of the dopant mask layer 302a on the front side of the silicon substrate 300 is removed according to a pattern to form an exposed silicon region 304 and an unexposed silicon region 306. The unexposed silicon region 306 remains covered by an unremoved portion of the dopant mask layer 302a. In this embodiment, the illustrative pattern forms a plurality of exposed silicon regions (including 304) and a plurality of unexposed silicon regions (including 306). As shown in FIG. 3B, the illustrative pattern is that of a grid having bars which correspond to channels formed in the dopant mask layer 302a that provide the exposed silicon regions (including 304). This also shows that the exposed silicon regions need not be isolated and discrete from one another, but rather may be connected to form a unitary structure, the dimensions and shape of which depend upon the selected pattern. The bars/channels define squares of unremoved portions of the dopant mask layer 302a therebetween that provide the unexposed silicon regions (including region 306). As further described below, these unexposed silicon regions ultimately correspond to the position of the silicon nitride windows of the microchip 318.

The pattern according to which the dopant mask layer 302a is removed is not particularly limited, but its selection may be guided by desired lateral dimensions (i.e., x and y) and shape for a silicon nitride window, number of silicon nitride windows, density of silicon nitride windows, as well as desired lateral dimensions and shape of a support structure mounted to the silicon nitride window(s). The present methods are able to provide relatively high densities of silicon nitride windows since spacings between adjacent windows (controllable by the lateral dimensions of the exposed silicon regions) may be made relatively small. For example, spacings between adjacent silicon nitride window may be no more than 500 μm, no more than 250 μm, no more than 100 μm, no more than 50 μm, or no more than 1 μm. This encompasses a range in between any of these values, including a range of from 0.5 μm to 500 μm, from 0.5 μm to 250 μm, from 1 μm to 100 μm, and from 1 μm to 10 μm. This is considerably smaller than the spacings achievable using conventional techniques, e.g., see FIG. 1, left image. Other patterns which may be used include honeycomb, truss, spoke, rectangle, circle, triangle, etc.

The pattern may be formed into the dopant mask layer 302a via photolithography, electron beam lithography, or another similar technique, e.g., by applying a photoresist onto the dopant mask layer 302a, exposing the photoresist, developing the photoresist, etching the dopant mask layer 302a (e.g., using a hydrofluoric acid bath, inductive coupled plasma-reactive ion etching, etc.), and removing remaining photoresist (e.g., using a solvent, acid, plasma, etc.).

In a step 305, the exposed silicon regions on the front side surface of the silicon substrate 300 (including 304) are doped with a p-type dopant. Illustrative p-type dopants which may be used include boron, aluminum, gallium, and indium. A single type of p-type dopant may be used (e.g., boron) or multiple, different types of p-type dopants may be used. The doping may be carried out using a diffusion furnace, ion implantation, or another similar technique. The doping step creates a p-type doped silicon region 308 within the silicon substrate 300. As shown in FIG. 3A, in this embodiment, the doping step creates a plurality of p-type doped silicon regions (including 308). Due to the unremoved portions of the dopant mask layer 302a covering the plurality of unexposed silicon regions (including 306) the silicon in the plurality of unexposed silicon regions remains undoped. Thus, in step 307 (and analogous such steps), the unexposed silicon region 306 may also be referred to as an undoped silicon region 306. The doping step is carried out to increase the concentration of holes within the p-type doped silicon regions as noted above. This includes carrying out the doping step to provide a concentration of the p-type dopant (holes) in the p-type doped silicon regions in a range of from $10^{19}$ cm$^{-3}$ to $10^{21}$ cm$^{-3}$. This includes from $10^{19}$ cm$^{-3}$ to $10^{20}$ cm$^{-3}$ and from $10^{20}$ cm$^{-3}$ to $10^{21}$ cm$^{-3}$. The doping depth, and thus, the thickness of the p-type doped silicon regions, is controllable via the parameters of the doping technique, but may be from a few tens of nanometers to a few micrometers, e.g., from 30 nm to 3 μm. This includes from 0.1 μm to 2.5 μm and from 0.5 μm to 2 μm. The lateral dimensions and shape of the p-type doped silicon regions depends upon the selected pattern as described above.

In a step 307, remaining portions of the dopant mask layer 302a are removed, e.g., by etching using hydrofluoric acid. As shown in FIG. 3A, the dopant mask layer 302b may also be removed.

In a step 309, a silicon nitride layer 310a is formed on the front side surface of the silicon substrate 300 which now comprises both the plurality of p-type doped silicon regions (including 308) and the plurality of undoped silicon regions (including 306). The silicon nitride may be low stress silicon nitride (LSN) which refers to silicon-rich silicon nitride (by contrast to stoichiometric $Si_3N_4$ silicon nitride). LSN may be formed using known techniques, e.g., plasma enhanced chemical vapor deposition (PE-CVD) or low-pressure chemical vapor deposition (LP-CVD). The thickness of the silicon nitride layer 310a may be in a range of from a few tens of nanometers to a few micrometers, e.g., from 30 nm to 2 μm. The silicon nitride layer 310a may comprise or consist of the silicon nitride, e.g., LSN. As shown in FIG. 3A, another silicon nitride layer 310b may be formed on the back side surface of the silicon substrate 300.

As shown in step 311, if present, a portion of the silicon nitride layer 310b may be removed to expose a portion of the back side surface of the silicon substrate 300. This may be carried out using the techniques described above with respect to removing a portion of the dopant mask layer 302a.

In a step 313, an opening is formed in the silicon substrate 300 from its back side surface. The opening is formed under conditions which remove undoped silicon without removing (or minimizing the removal of) the plurality of p-type doped silicon regions (including 308) and without removing (or minimizing the removal of) the silicon nitride layer 310a. This may be accomplished, e.g., by using a basic solvent such as potassium hydroxide, ammonium hydroxide, sodium hydroxide, or ethylenediamine pyrocatechol (EDP). This provides the microchip 318 comprising the silicon substrate 300 having the opening defined therein, a silicon nitride window 312 positioned within the opening, and a support structure 314 (best viewed in FIG. 3B) comprising the plurality of p-type doped silicon regions (including 308) mounted to the silicon nitride window 312. The silicon nitride window 312 (and other similar silicon nitride windows herein may comprise or consist of silicon nitride). Due to the pattern used, in this embodiment, the microchip 318 comprises a plurality of silicon nitride windows (including 312) positioned within the opening. In addition, the support structure 314 is in the form of a grid, the bars of which form frames surrounding each silicon nitride window around its perimeter. This is shown most clearly in the bottom right image of FIG. 3B in which the silicon nitride window 312 is labeled, framed by bars of the support structure 314. This silicon nitride window 312 corresponds to the position of the unexposed silicon region 306 that was underneath an unremoved portion of the dopant mask layer 302a (see the bottom left image of FIG. 3B). The bars forming a frame surrounding the silicon nitride window 312 correspond to the exposed silicon regions (including 304) formed via step 303, which were converted to p-type doped silicon regions (including 308) via step 305. Due to the formation of the silicon nitride layer 310a in step 309, the support structure 314 further comprises an overlayer of silicon nitride on each p-type doped silicon region. The overlayer on the p-type doped silicon region 308 is labeled 316. The silicon nitride windows (including 312) are mounted to the support structure 314 through these silicon nitride overlayers (including 316), which extend laterally from respective windows.

If desired, in a step 315, various additional layers/elements 320, 322 (e.g., spacers, electrodes, etc.) may be formed, e.g., on the silicon nitride layer 310a.

As shown in FIG. 3A, a step 317 is generally carried out in which portions of the silicon nitride layer 310a are thinned (e.g., using induction coupled plasma-reactive ion etching). In FIG. 3A, the thinning is conducted from the back side surface of the silicon nitride layer 310a, but thinning may be conducted from the front side surface thereof. (The front side surface and back side surface of the silicon nitride layer 310a are analogous to the front side surface and back side surface of the silicon substrate 300, respectively.) The portions which are thinned correspond to the plurality of silicon nitride windows, including 312. This provides the plurality of silicon nitride windows (including 312) as a plurality of ultrathin silicon nitride windows. The thickness of an ultrathin silicon nitride window is generally selected to maximize resolution (taking into account issues of deflection and scattering as described above) of an image formed using the microchip, e.g., in an electron microscope. Illustrative thicknesses include no more than 5 nm, no more than 10 nm, no more than 15 nm, no more than 20 nm, no more than 25 nm, no more than 30 nm, no more than 35 nm, no more than 40 nm, no more than 45 nm, or no more than 50 nm. This includes a range between any of these values, e.g., from 5 nm to 30 nm. It is to be understood that the thinning step may occur at a different point in the present methods, e.g., after wafer dicing.

Other steps (not illustrated in FIGS. 3A and 3B) which may be used include applying a protection layer (e.g., a polymer film such as a photoresist) may be applied over the front side surface of the microchip 318 to prevent damage and contamination during subsequent handling and/or other steps. (The front side surface and back side surface of the microchip 318 is analogous to the front side surface and back side surface of the silicon substrate 300, respectively.) The protection layer may be applied, e.g., prior to step 317. Prior to use, e.g., in an electron microscope, the microchip 318 may be cut (e.g., via blade, laser ablation, mechanical cleaving, etc.) to desired dimensions (e.g., in a range from several millimeters to centimeters). If present, the protection layer may be removed, e.g., using a solvent, acid, or high-power plasma.

Figure 4:
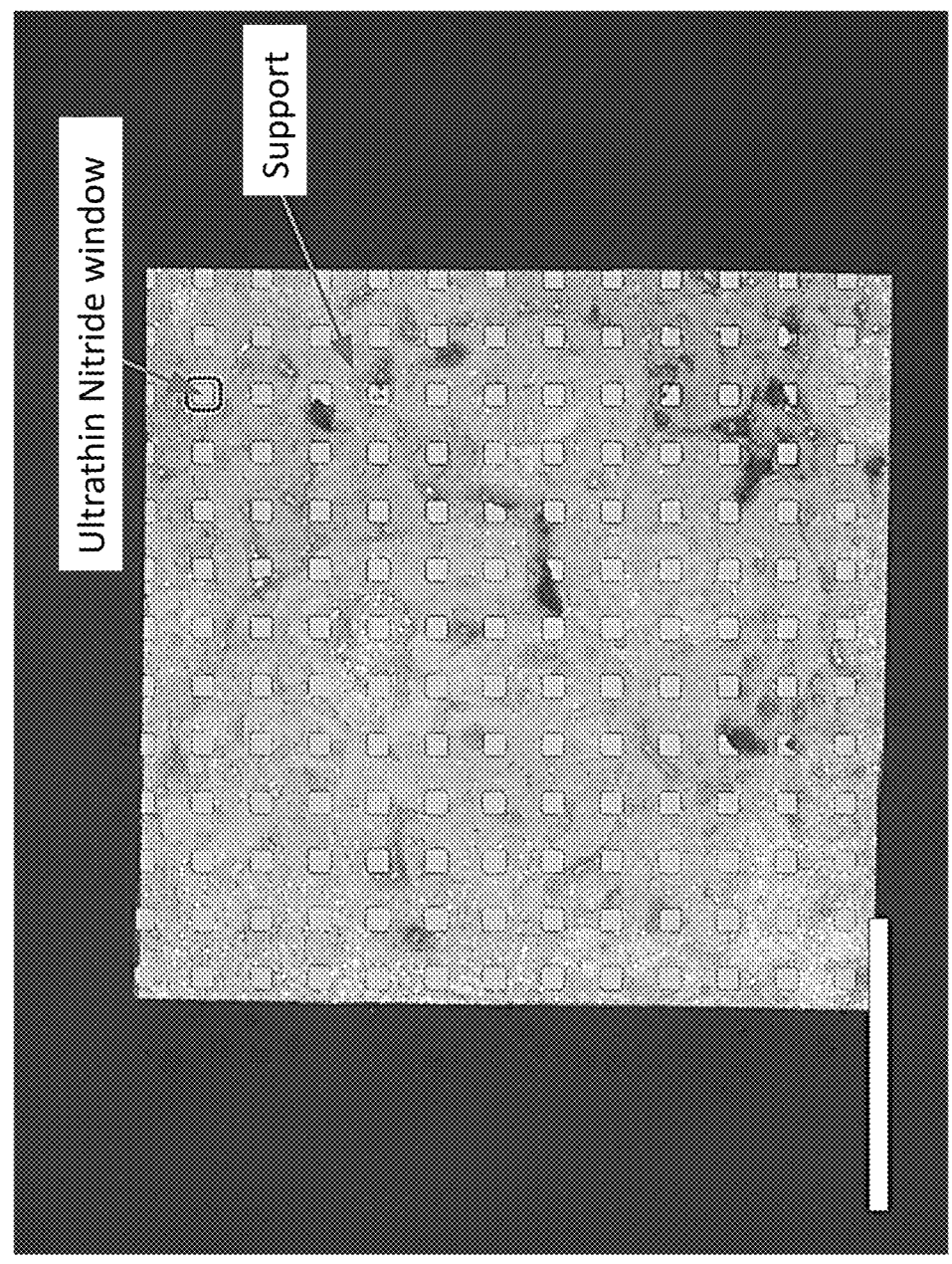
FIG. 4 shows an optical microscope image of an illustrative microchip fabricated according to the method of FIGS. 3A-3B. The scale bar is 100 μm.

An image of an illustrative microchip fabricated according to the method illustrated in FIGS. 3A and 3B is shown in FIG. 4. An ultrathin silicon nitride window of an array of such windows is labeled along with the support structure mounted to the array.

Figure 5A:
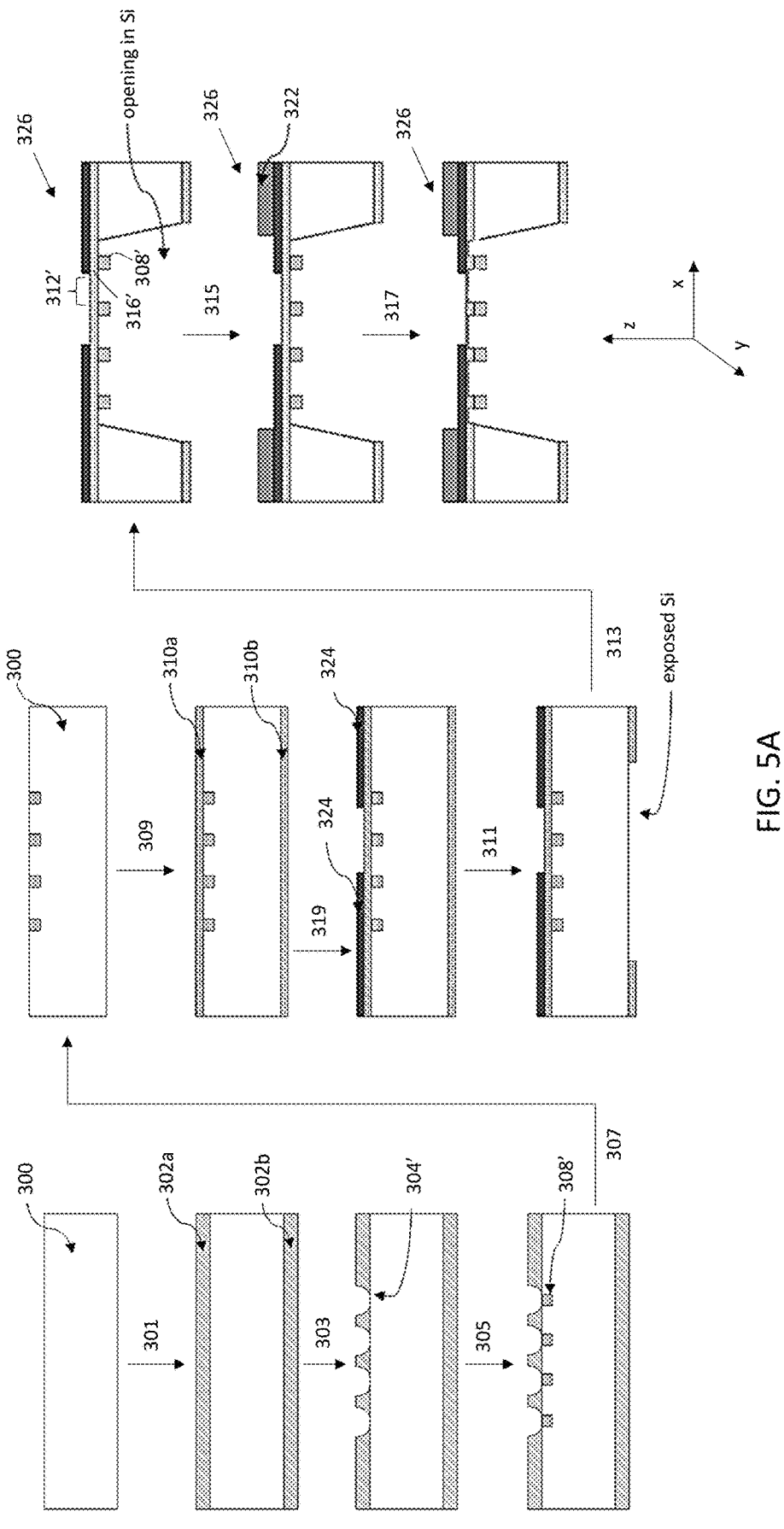
FIG. 5A shows cross-sectional views of the steps of another illustrative method for fabricating a microchip.
Figure 5B:
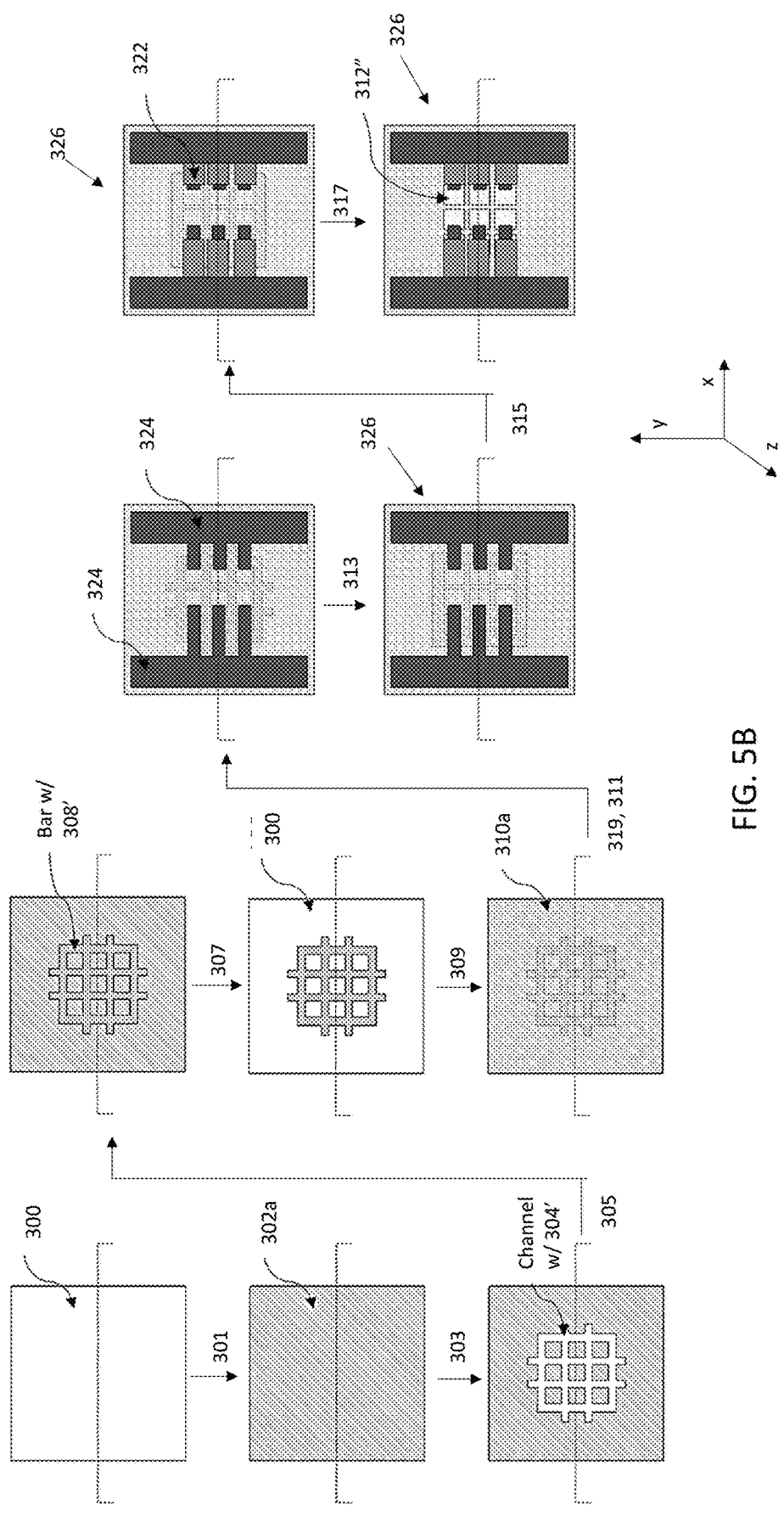
FIG. 5B shows top, in-plane views of the steps of the illustrative method of FIG. 5A.

The steps of another illustrative method for fabricating a microchip 326 are illustrated in FIGS. 5A and 5B. FIG. 5A shows cross-sectional views (taken along the xz plane) for steps 301-319 while FIG. 5B shows top, in-plane views (taken along the xy plane) during the method. The steps and the order shown are not intended to be limiting, as variations may be used in which additional or fewer steps are used and/or a different order is used.

The illustrative method shown in FIGS. 5A-5B is a variation of that of FIGS. 3A-3B in which like elements are labeled with the same reference numbers. However, 304' is used to indicate another one of the plurality of exposed silicon regions; 308' is used to indicate another one of the plurality of p-type doped silicon regions; 316' is used to indicate another one of the silicon nitride overlayers; and 312' and 312" are used to indicate other ones of the silicon nitride windows.

The variation in the illustrative method shown in FIGS. 5A-5B involves use of a step 319 between steps 309 and 311 in which an electrode layer 324 is formed on the silicon nitride layer 310a. The configuration (e.g., lateral dimensions, thickness, shape, arrangement relative to the silicon nitride windows) of the electrode layer 324 is selected based upon the desired application for the microchip 326, but generally, the configuration is one that allows for the application of an electric potential across one or more silicon nitride windows (or groupings thereof) of the microchip 326. For example, a 3-electrode configuration (as illustrated in FIGS. 5A-5B) may be used to carry out an electrochemical reaction on a sample in contact with a silicon nitride window. A 4-electrode configuration may be used for resistance measurements. A 2-electrode or connected electrode configuration may be used to provide a Joule heater. The composition of the electrode layer 324 is also selected based upon the desired application, but is generally conductive, e.g., a metal, a conductive polymer, a conductive ceramic, etc. In step 315, the element 322, which in this embodiment may be a protective layer, may be formed on the electrode layer 324 (rather than on the silicon nitride layer 310a).

Figure 6A:
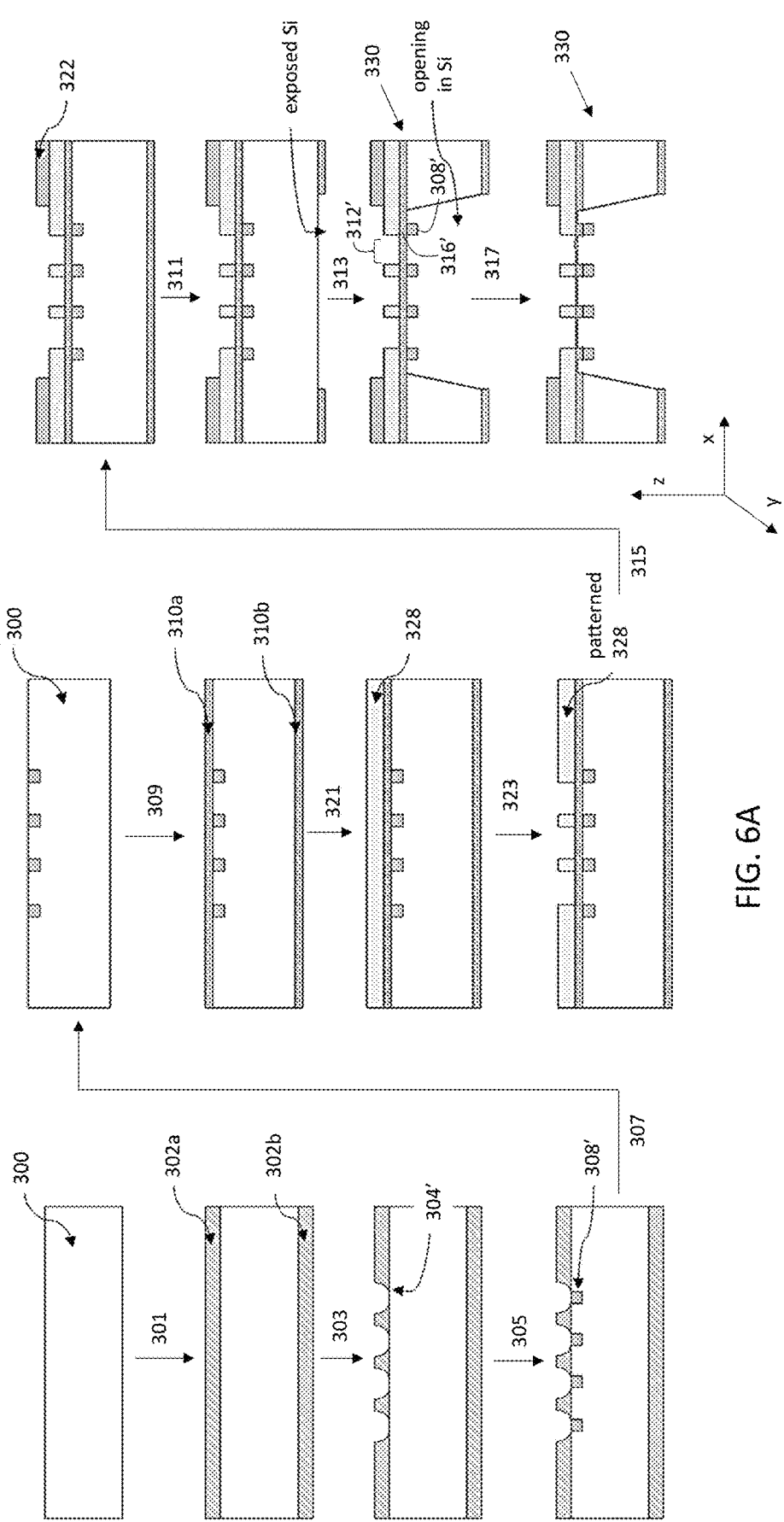
FIG. 6A shows cross-sectional views of the steps of another illustrative method for fabricating a microchip.
Figure 6B:
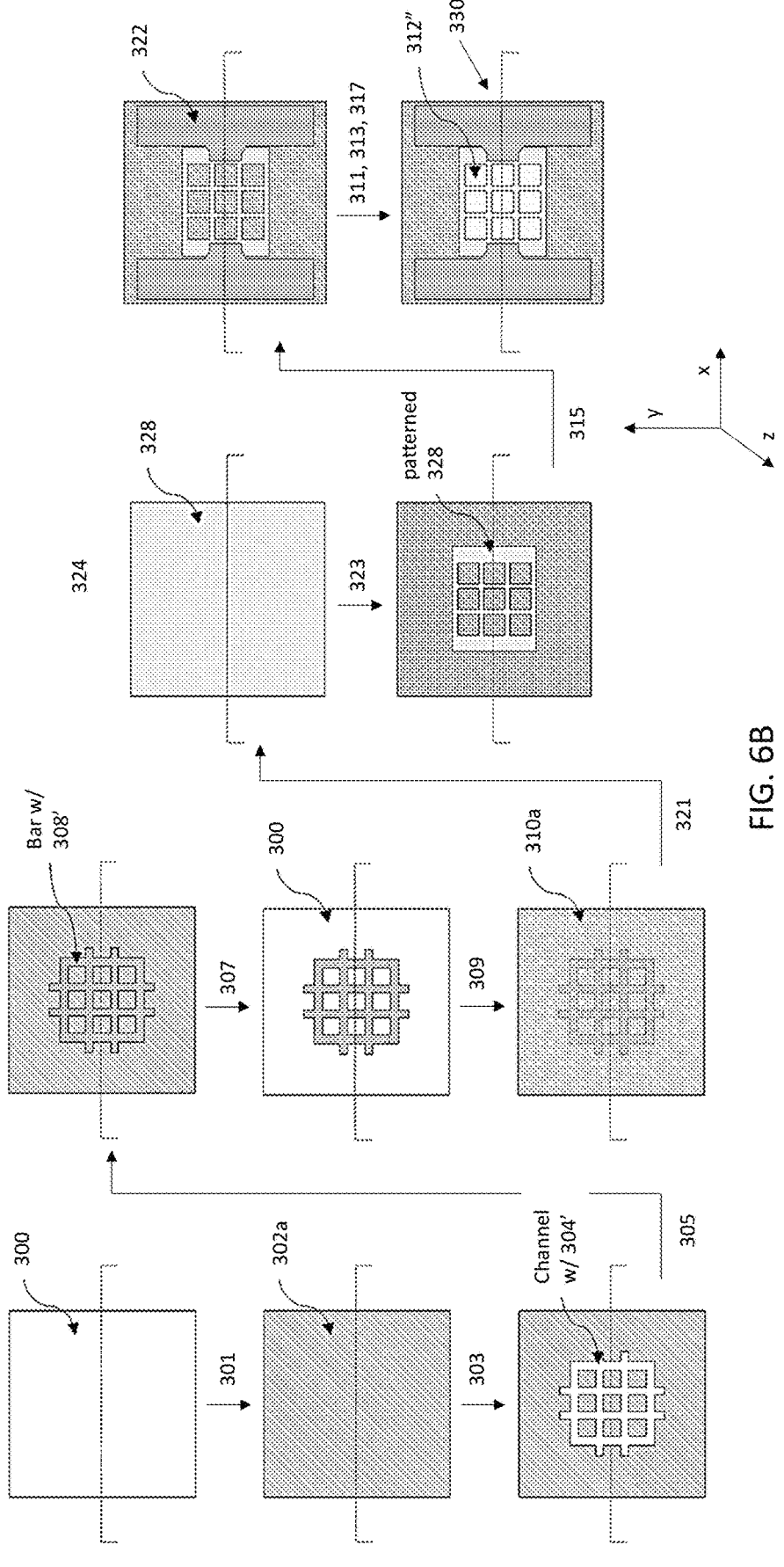
FIG. 6B shows top, in-plane views of the steps of the illustrative method of FIG. 5A.

The steps of another illustrative method for fabricating a microchip 330 are illustrated in FIGS. 6A and 6B. FIG. 6A shows cross-sectional views (taken along the xz plane) for steps 301-323 while FIG. 6B shows top, in-plane views (taken along the xy plane) during the method. The steps and the order shown are not intended to be limiting, as variations may be used in which additional or fewer steps are used and/or a different order is used.

The illustrative method shown in FIGS. 6A-6B is a variation of that of FIGS. 3A-3B in which like elements are labeled with the same reference numbers. However, 304' is used to indicate another one of the plurality of exposed silicon regions; 308' is used to indicate another one of the plurality of p-type doped silicon regions; 316' is used to indicate another one of the silicon nitride overlayers; and 312' and 312" are used to indicate other ones of the silicon nitride windows.

The variation in the illustrative method shown in FIGS. 6A-6B involves use of steps 321 and 323 between steps 309 and 311 in which a heater layer 328 is formed on the silicon nitride layer 310a (step 321) and then patterned (step 323). The configuration of the pattern (e.g., lateral dimensions, thickness, shape, arrangement relative to the silicon nitride windows) of the heater layer 328 is generally selected so as to provide heat to a sample in contact with one or more silicon nitride windows of the microchip 330. At the same time, the configuration of the pattern desirably minimizes blockage of the silicon nitride window(s). Accordingly, the pattern desirably overlaps with one or more of the p-type doped silicon regions as shown in FIG. 6A. The composition of the heater layer 328 is selected based upon an ability to generate heat upon generation of an electrical current therethrough. Suitable such materials include high resistivity materials such as silicon carbide, titanium nitride, etc. In step 315, the element 322, which in this embodiment may be an electrode layer composed of a material having lower resistivity than the heater layer 328, may be formed thereon (rather than on the silicon nitride layer 310a). In another variation, step 315 is carried out prior to steps 311 and 313.

The illustrative methods shown in FIGS. 5A-5B (involving formation of an electrode layer) and FIGS. 6A-6B (involving formation of a heater layer) provide microchips that may be used to carry out various (electro)chemical reactions with samples in contact with the silicon nitride window(s) thereof. In addition, the ability to heat the microchip/sample thereon facilitates removal of contaminant species on the silicon nitride window(s) or a sample cell defined by a microchip stack having such window(s).

Figure 7:
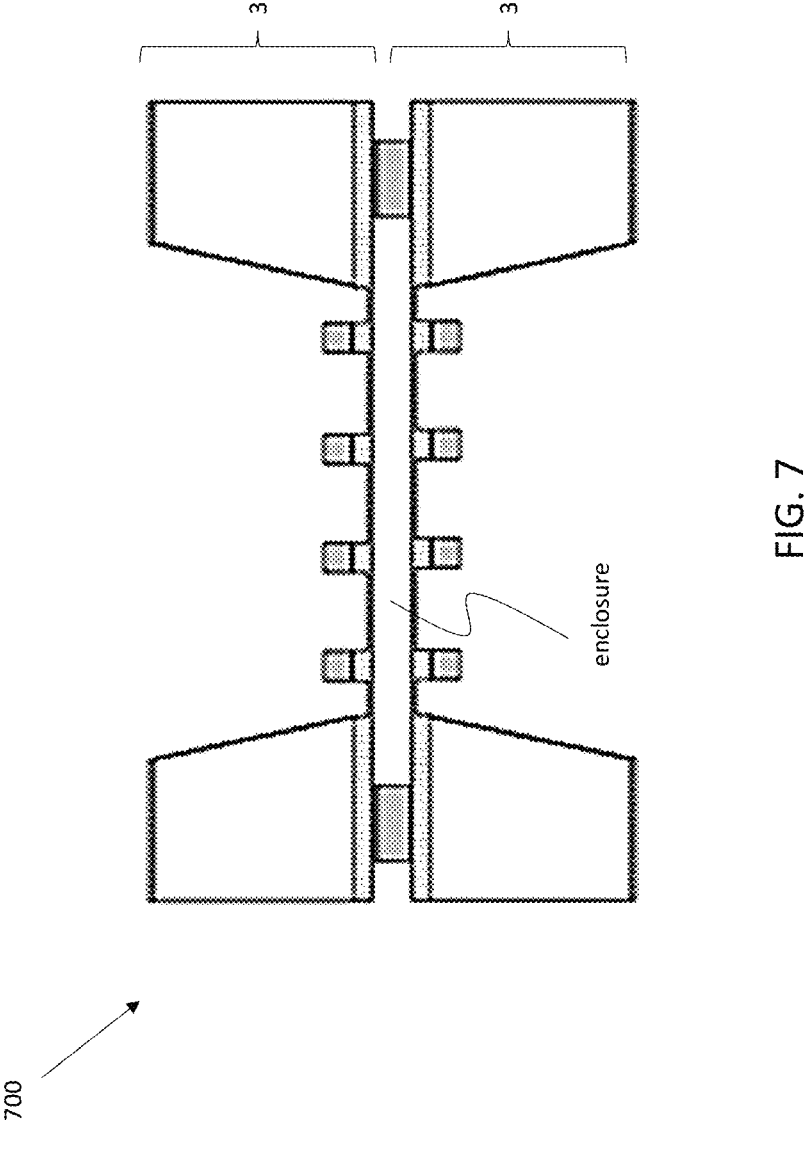
FIG. 7 shows a cross-sectional view of an illustrative stack comprising two microchips according to microchip 318 of FIGS. 3A-3B.

The present disclosure further encompasses any of the microchips fabricated using the disclosed methods. In a basic embodiment, a microchip is provided which comprises a silicon substrate having a front side surface, a back side surface, and an opening extending from the back side surface to the front side surface; a silicon nitride window positioned within the opening (and generally at the front side surface of the silicon substrate); and a support structure mounted (generally at a back side surface of the silicon nitride window) to the silicon nitride window, the support structure comprising a p-type doped silicon region. The microchip may comprise a single silicon nitride window or a plurality of silicon nitride windows. The plurality of silicon nitride windows may be arranged in an array. Each silicon nitride window in the plurality/array may have the same lateral dimensions/shape as one another or different windows may have different lateral dimensions/shapes. Other features of the microchip follow from the description provided above. Also provided is a stack of two or more of any of the microchips described herein. In the stack, each microchip may be configured to provide an enclosure capable of encapsulating a fluid (liquid or gas), including a sample, therein. An illustrative stack 700 comprising two microchips according to microchip 318 is shown in FIG. 7.

The microchips may be used in an electron microscope system, including a transmission electron microscope (TEM) or a scanning transmission electron microscope (STEM). Methods of using the microchips in such systems are also provided. In a basic embodiment, such a method comprises depositing a sample on a silicon nitride window(s) of any of the disclosed microchips; exposing the sample to an electron beam; and detecting electrons scattered from and/or transmitted through the sample. If the microchips are provided as a stack, the method may comprise introducing the sample into an enclosure of the stack. The electron microscope systems/methods are not intended to be limiting as the microchips may be used in other types of microscopes, e.g., light microscopes. Similarly, the microchips may be used in acoustic, pressure, or mechanical MEMS sensors.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more."

If not already included, all numeric values of parameters in the present disclosure are proceeded by the term "about" which means approximately. This encompasses those variations inherent to the measurement of the relevant parameter as understood by those of ordinary skill in the art. This also encompasses the exact value of the disclosed numeric value and values that round to the disclosed numeric value.

The foregoing description of illustrative embodiments of the disclosure has been presented for purposes of illustration and of description. It is not intended to be exhaustive or to limit the disclosure to the precise form disclosed, and modifications and variations are possible in light of the above teachings or may be acquired from practice of the disclosure. The embodiments were chosen and described in order to explain the principles of the disclosure and as practical applications of the disclosure to enable one skilled in the art to utilize the disclosure in various embodiments and with various modifications as suited to the particular use contemplated. It is intended that the scope of the disclosure be defined by the claims appended hereto and their equivalents.

What is claimed is:

1. A method for fabricating a microchip, the method comprising:

(a) forming a dopant mask layer on a front side surface of a silicon substrate having the front side surface and an opposing back side surface;

(b) removing a portion of the dopant mask layer according to a pattern to form a first exposed silicon region in the silicon substrate and a first unexposed silicon region in the silicon substrate;

(c) doping the first exposed silicon region in the silicon substrate with a p-type dopant to form a first p-type doped silicon region in the silicon substrate;

(d) forming a silicon nitride layer on the front side surface of the silicon substrate comprising the first p-type doped silicon region and the first unexposed silicon region; and (e) forming an opening in the silicon substrate from the opposing back side surface of the silicon substrate to provide a microchip comprising the silicon substrate having the opening, a first silicon nitride window positioned within the opening, and a support structure mounted to the first silicon nitride window, the support structure comprising the first p-type doped silicon region.

2. The method of claim 1, wherein the pattern provides a plurality of unexposed silicon regions comprising the first unexposed silicon region and the microchip comprises a plurality of silicon nitride windows comprising the first silicon nitride window, each silicon nitride window having a position corresponding to a respective unexposed silicon region of the plurality of unexposed silicon regions.

3. The method of claim 2, wherein a spacing between adjacent silicon nitride windows of the plurality of silicon nitride windows is no more than 500 μm.

4. The method of claim 1, wherein the support structure further comprises a portion of the silicon nitride layer formed on the first p-type doped silicon region.

5. The method of claim 1, wherein the support structure surrounds a perimeter of the first silicon nitride window.

6. The method of claim 2, wherein the support structure comprises a p-type doped silicon layer comprising the first p-type doped silicon region, the support structure further comprises a portion of the silicon nitride layer formed on the p-type doped silicon layer, and further wherein, the support structure surrounds a perimeter of each silicon nitride window of the plurality of silicon nitride windows.

7. The method of claim 6, wherein a spacing between adjacent silicon nitride windows of the plurality of silicon nitride windows is no more than 100 μm.

8. The method of claim 1, wherein the silicon substrate has a hole concentration of less than $10^{19}$ cm$^{-3}$.

9. The method of claim 1, wherein the silicon substrate is an undoped silicon substrate.

10. The method of claim 1, wherein the p-type dopant is selected from boron, aluminum, gallium, indium, and combinations thereof.

11. The method of claim 10, wherein the p-type dopant is boron.

12. The method of claim 1, wherein the first p-type doped silicon region is doped to provide a concentration of the p-type dopant of greater than $10^{19}$ cm$^{-3}$.

13. The method of claim 1, further comprising, after forming the opening in the silicon substrate, step (f), thinning a region of the silicon nitride layer adjacent the first p-type doped silicon region to provide the silicon nitride window.

14. The method of claim 13, wherein the silicon nitride window has a thickness of no more than 10 nm.

15. The method of claim 1, further comprising forming an electrode layer on the silicon nitride layer, the electrode layer configured to apply an electric potential across the first silicon nitride window or an enclosure encapsulated by the first silicon nitride window.

16. The method of claim 1, further comprising forming a heater layer on the silicon nitride layer, the heater layer configured to provide heat to the first silicon nitride window or an enclosure encapsulated by the first silicon nitride window.

* * * * *